US008722527B2

(12) United States Patent
Ernur et al.

(10) Patent No.: US 8,722,527 B2
(45) Date of Patent: May 13, 2014

(54) INTEGRATED CIRCUIT MANUFACTURING METHOD AND INTEGRATED CIRCUIT

(75) Inventors: Didem Ernur, Kessel-Lo (BE); Romano Hoofman, Geel (BE)

(73) Assignee: NXP B.V., Eindhoven (NL)

( * ) Notice: Subject to any disclaimer, the term of this patent is extended or adjusted under 35 U.S.C. 154(b) by 446 days.

(21) Appl. No.: 12/994,628

(22) PCT Filed: May 19, 2009

(86) PCT No.: PCT/IB2009/052084
§ 371 (c)(1),
(2), (4) Date: Dec. 21, 2011

(87) PCT Pub. No.: WO2009/144618
PCT Pub. Date: Dec. 3, 2009

(65) Prior Publication Data
US 2012/0126408 A1 May 24, 2012

(30) Foreign Application Priority Data

May 27, 2008 (EP) .................................... 08156980

(51) Int. Cl.
*H01L 21/44* (2006.01)

(52) U.S. Cl.
USPC .... 438/612; 257/741; 257/774; 257/E21.586; 257/E23.011

(58) Field of Classification Search
USPC .................. 257/741, 774, E21.586, E23.011; 438/612
See application file for complete search history.

(56) References Cited

U.S. PATENT DOCUMENTS

| 6,713,835 | B1 | 3/2004 | Horak et al. |
| 2002/0158337 | A1 | 10/2002 | Babich |
| 2004/0063305 | A1 | 4/2004 | Kloster et al. |
| 2004/0127001 | A1 | 7/2004 | Colburn et al. |
| 2004/0222533 | A1 | 11/2004 | Nakamura et al. |
| 2004/0245637 | A1 | 12/2004 | Horak et al. |
| 2005/0037604 | A1 | 2/2005 | Babich et al. |

OTHER PUBLICATIONS

Gossett, L. G., et al; "Advanced Cu Interconnects Using Air Gaps"; Microelectronic Engineering 82; pp. 321-332 (2005).
Daamen, R., et al; "The Evolution of Multi-Level Air Gap Integration Towards 32 NM Node Interconnects"; Micoelectronic Engineering 84; pp. 2177-2183 (2007).
Daamen, R., et al., "Air Gap Integration for the 45nm Node and Beyond"; Proceedings of the IEEE Interconnect Technology Conference; 3 Pages; (2005).
Mercado, L. L., et al; IEEE Transactions on Device and Materials Reliability, vol. 3, No. 4; (2003).
Ker, Ming-Dou, et al; "Fully Process-Compatible Layout Design on Boand Pad to Improve Wire Bond Reliability in CMOS ICs"; IEEE Transactions on Components and Packaging Technologies, vol. 25, No. 2; (Jun. 2002).

(Continued)

*Primary Examiner* — Marvin Payen

(57) ABSTRACT

The present invention discloses an integrated circuit (IC) comprising a bond pad (160); a substrate stack carrying a first layer (130) comprising conductive regions (135); and an interconnect layer (140) over the first layer (130) comprising a dielectric material portion (400) between the bond pad (160) and the substrate stack, said portion comprising a plurality of air-filled trenches (345) defining at least one pillar (340) of the dielectric material (400), at least said air-filled trenches (345) being capped by a porous capping layer (440). The interconnect layer (140), which typically is one of the uppermost interconnect layers of the IC, has an improved resilience to pressure exerted on the bond pad (160). The present invention further teaches a method for manufacturing such an IC.

12 Claims, 6 Drawing Sheets

(56) References Cited

OTHER PUBLICATIONS

Kripesh, V., et al; Proceedings of 2002 Electronic Components and Technology Conference (2002).

Korczynski, ED; "Airgaps & Chip Stacks"; 070608: IITC2007; Begins p. 3; (2007).

International Search Report and Written Opinion for Application PCT/IB2009/052084 (Sep. 7, 2009).

INTEGRATED CIRCUIT MANUFACTURING METHOD AND INTEGRATED CIRCUIT

FIELD OF THE INVENTION

The present invention relates to a method of manufacturing an integrated circuit (IC) comprising providing a substrate stack carrying a first layer comprising conductive regions and forming a interconnect layer over the first layer, said interconnect layer comprising a portion to be oriented between a bond pad and the substrate stack.

The present invention further relates to an IC comprising a bond pad; a substrate stack carrying a first layer comprising conductive regions; and a layer of a dielectric material over the first layer, said dielectric material comprising a portion between the bond pad and the substrate stack.

BACKGROUND OF THE INVENTION

In deep submicron IC technology, one of the main design challenges is the provision of metal interconnects that, although being located in close vicinity to neighboring metal interconnects, experience little detrimental influence, e.g. capacitive coupling, from their neighbors. Several solutions have been proposed. For instance, low-k materials have been introduced in the buried interconnect layers between the metal tracks of such layers to reduce the amount of capacitive coupling. Recently, proposals even include the replacement of the low-k material in such buried interconnect layers with air gaps to further reduce the capacitive coupling between neighboring interconnects. An example of the introduction of air gaps is for instance disclosed in "Advanced Cu interconnects using air gaps" by L. G. Gossett et al. in Microelectronic Engineering, 82 (2005), pages 321-332 and in "The evolution of multi-level air gap integration towards 32 nm node interconnects" by R. Daamen et al. in Microelectronic Engineering, 84 (2007), pages 2177-2183.

However, such measures are not appropriate for the uppermost interconnect layer because this layer is typically exposed to significant mechanical forces during the back-end processing steps in the IC manufacturing. This is for instance demonstrated in FIG. 1, which shows a cross-section of an integrated circuit. The substrate 100, which typically includes the semiconductor devices such as transistors, diodes and so on, is covered by a number of interconnect layers 120, each comprising patterned metal portions 125 separated by a suitable dielectric material. The interconnect layers 120 are typically separated by via layers 130, including vias 135 that interconnect metal portions 125 in different interconnect layers 120. The uppermost interconnect layer 140 is the interconnect layer that is closest to the bond pads 160 of the IC, which are typically embedded in a passivation layer 150. In FIG. 1, the uppermost interconnect layer 140 has a dielectric material portion 145 located underneath the bond pad 160. In FIG. 1, the bond pad 160 is shown with a metal cap 170.

Upon wire-bonding the bond pad 160, the mechanical forces on the bond pad 160 to ensure a good connection between the bond pad 160 and a wire (not shown) can cause damage to the dielectric material portion 145, e.g. delamination, cracking or even collapse of the interconnect layer 140. Similar mechanical forces may for instance be experienced during some packaging steps, e.g. molding. Such damage is likely to cause electrical failures within the IC at some point during its lifetime. For this reason, relatively brittle low-k materials are avoided in the uppermost interconnect layers of an IC. However, even more robust dielectric materials, e.g. $SiO_2$, can still suffer damage when exposed to such mechanical forces.

A known solution is disclosed in FIG. 2, which shows a cross-section of another IC design. Here, the area 245 of the interconnect layer 140 under the bond pad 160 is filled with metal interconnect portions to ensure that the metal, which typically is more rigid than the dielectric material in the interconnect layer 140 in between the metal portions, absorbs most of the pressure forces exerted on the IC during subsequent process steps. However, the introduction of such a design rule significantly reduces the flexibility of the interconnect design, which may prohibit the adequate routing of the required interconnections in the design stage of the IC.

SUMMARY OF THE INVENTION

The present invention seeks to provide a method of manufacturing an IC having improved structural integrity.

The present invention further seeks to provide an IC having improved structural integrity.

According to an aspect of the present invention, there is provided a method of manufacturing an integrated circuit comprising providing a substrate stack carrying a first layer comprising conductive regions; forming an interconnect layer over the first layer, said interconnect layer comprising a dielectric portion to be oriented between a bond pad and the substrate stack; forming a plurality of trenches in said portion; filling said trenches with a thermally degradable polymer; forming a further layer over the interconnect layer; thermally decomposing said polymer; and forming the bond pad over said portion.

In accordance with the method of the present invention, a portion of a dielectric material in an interconnect layer underneath a bond pad is patterned such that a plurality of air gaps are formed, thereby defining one or more pillars of the dielectric material underneath the bond pad area. The pillars provide structural support for preventing damage to the interconnect layer under pressure exerted on the bond pad. The first layer may be a metal layer, which may be patterned.

The formation of pillars of the dielectric material under the bond pad improves the elastical flexibility of the portion of the interconnect layer under the bond pad compared to a continuous dielectric material portion as shown in FIG. 1. So even though less dielectric material may be present under the bond pad, the resilience of the interconnect layer is nevertheless improved. The dielectric material may be chosen to be any material that has a high enough density to withstand the mechanical forces exerted e.g. during the wire-bonding process, e.g. silicon oxide or a dense low-k material.

The introduction of the air-filled trenches has the additional advantage that the dielectric constant of the dielectric material has become less critical because the air-filled trenches help to reduce the capacitive coupling between neighboring metal tracks. This enables the choice of dielectric materials for the uppermost interconnect layer that would not have been considered previously because of the performance issues associated with the capacitive coupling between neighboring metal portions in this interconnect layer.

The dielectric material may be used in combination with a fluorosilicate glass for the via layers, which further improves the structural integrity of the IC.

The trenches may be formed by forming a hard mask over the interconnect layer; depositing a resist over the hard mask; patterning the resist; and etching the plurality of trenches. The resist may be removed after said etching step. Any suitable hard mask and resist material may be used.

The trenches may be filled by depositing the thermally degradable polymer over the interconnect layer, thereby filling said trenches; and subsequently removing excess thermally degradable polymer. Any suitable deposition technique such as spin-coating may be used.

In an embodiment, the method further comprises forming, in said portion, at least one further trench over at least one of said regions following said filling step, and wherein forming the further layer comprising forming a further metal layer over the interconnect layer, said forming step including filling the at least one further trench with the further metal. In this case, the portion underneath the bond pad comprises both air-filled trenches and metal-filled, e.g. copper-filled trenches, with the air-filled trenches typically located between a pair of metal-filled trenches, with at least one of said metal-filled trenches being located in said portion.

The at least one further trench may be formed by depositing a further hard mask over the interconnect layer; depositing a further resist over the further hard mask; patterning the further resist; and etching the at least one further trench. The further resist may be removed after forming the further trench in order to facilitate deposition of the filler material over the interconnect layer.

According to a further aspect of the present invention, there is provided an integrated circuit comprising a bond pad; a substrate stack carrying a first layer comprising conductive regions; and an interconnect layer over the first layer, said interconnect layer comprising a dielectric material portion between the bond pad and the substrate stack, said portion comprising a plurality of air-filled trenches defining at least one pillar of the dielectric material. Such an IC benefits from improved structural integrity under its bond pads, as previously explained. Such an IC may be integrated in an electronic device, which can benefit from improved reliability of its functionality controlled by the IC of the present invention.

BRIEF DESCRIPTION OF THE DRAWINGS

Embodiments of the invention are described in more detail and by way of non-limiting examples with reference to the accompanying drawings, wherein.

It should be understood that the Figures are merely schematic and are not drawn to scale. It should also be understood that the same reference numerals are used throughout the Figures to indicate the same or similar parts.

DETAILED DESCRIPTION OF THE EMBODIMENTS

Figure 1:
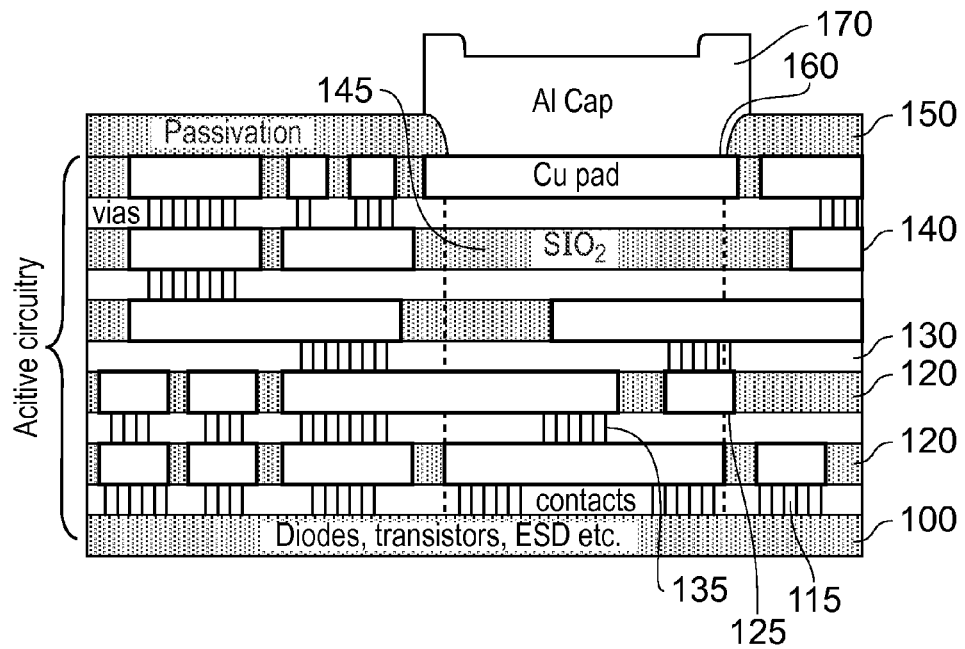
FIG. 1 depicts a typical bond pad design on a substrate stack.
Figure 2:
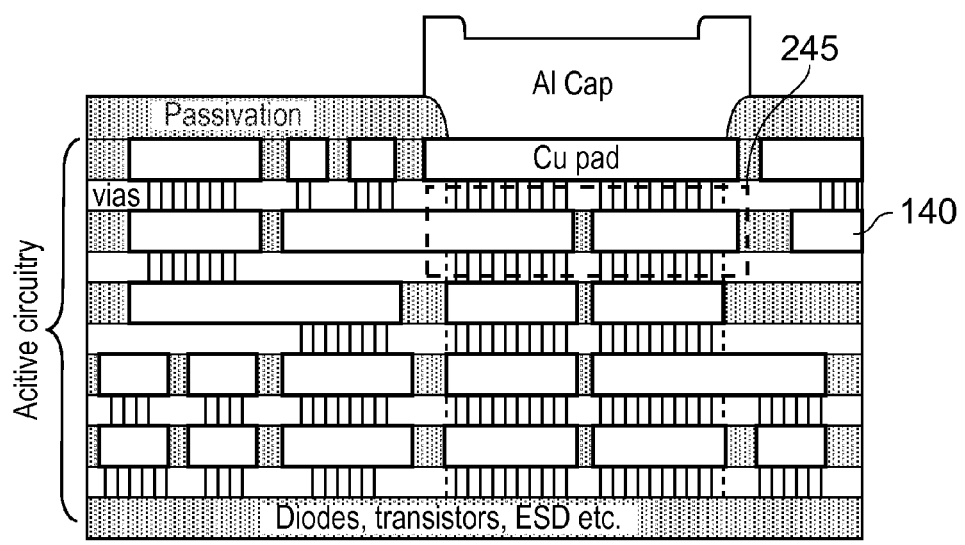
FIG. 2 depicts another typical bond pad design on a substrate stack.
Figure 3:
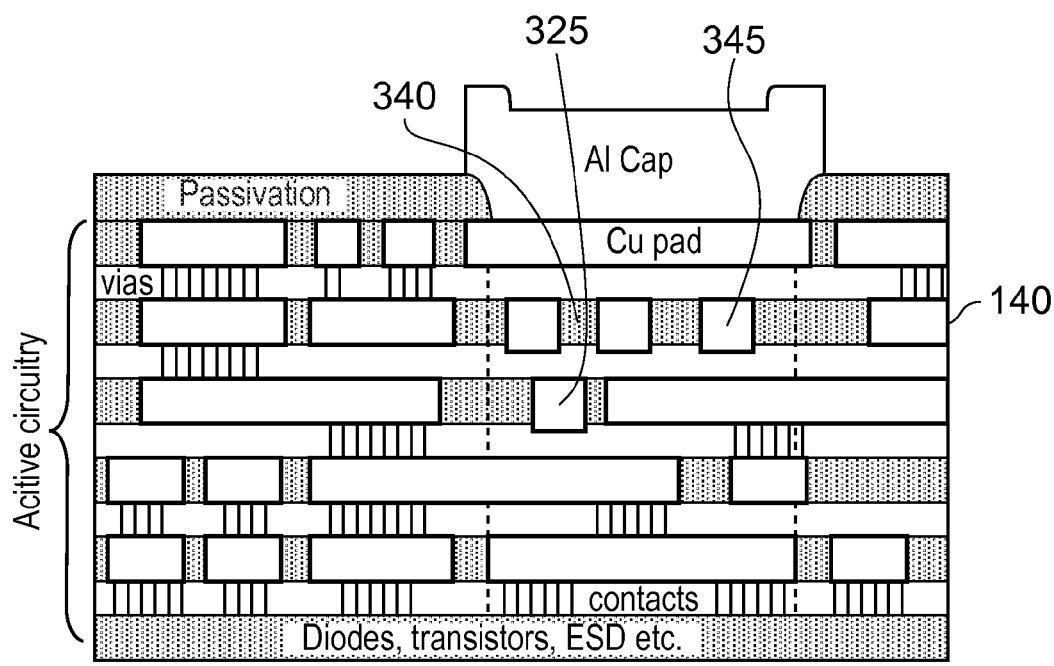
FIG. 3 depicts a bond pad design in accordance with an embodiment of the present invention.

FIG. 3 shows a cross-section of an IC according to the present invention. Compared to FIG. 1, the uppermost interconnect layer 140 comprises a plurality of air-filled trenches 345 in the region under the bond pad 160, such that a number of pillars 340 of the dielectric material are formed. The pillars 340 ensure that the interconnect layer 140 can absorb mechanical forces exerted on the bond pad 160, e.g. during wire-bonding the bond pad 160 to a wire (not shown), because the pillars 340 have the ability to deform under the mechanical forces.

It will be appreciated that the introduction of the pillars 340 is not limited to the uppermost interconnect layer 140 but may be extended to any interconnect layer that has to absorb such mechanical forces. For this reason, a further air-filled trench 325 is shown in the interconnect layer immediately below the uppermost interconnect layer 140 in FIG. 3.

It will also be appreciated that the materials and process steps chosen for realizing the various components of the IC of the present invention other than the formation of the air-filled trenches are not critically important to the present invention. Any suitable material and/or process steps may be used.

An embodiment of the method of the present invention facilitating the formation of air gaps in a layer such as the uppermost interconnect layer 140 is given in FIGS. 4a-m.

Figure 4A:
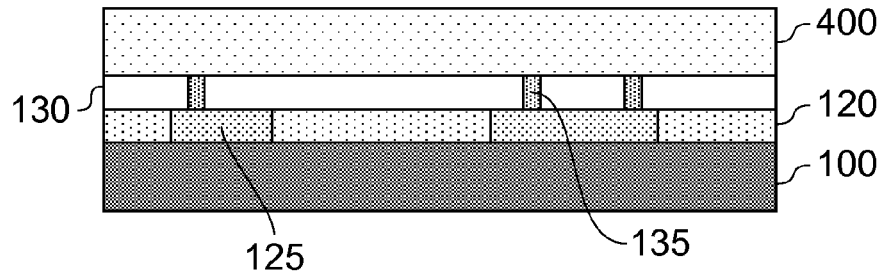
FIGS. 4a-m depict the various steps of a method in accordance with an embodiment of the present invention.

As shown in FIG. 4a, a substrate 100 including a number of interconnect layers 120 and via layers 130 is provided. The substrate 100 typically comprises semiconductor devices such as diodes, transistors, ESD protection and so on. The interconnect layers typically comprise a number of metal portions 125 that are separated by air gaps and/or dielectric material, as is well-known in the art, and the via layers 130 typically comprise a number of vias 135 interconnecting metal portions 125 in different interconnect layers 120. It is reiterated that such a stack may be formed in any suitable way.

In accordance with the present invention, a dielectric layer 400 is deposited over the substrate stack, which will serve to form an interconnect layer 140 in accordance with the present invention. The dielectric material, e.g. a high density low-k material or silicon oxide ($SiO_2$) may be deposited in any suitable way, e.g. by means of a vapor deposition technique or spin-on coating. Alternative techniques will be apparent to the skilled person. It is pointed out that in FIG. 4a the layer thickness of dielectric material 400 is exaggerated for the purpose of clearly demonstrating the method of the present invention. The thickness of the dielectric material layer may be any suitable thickness and may for instance be similar to the thickness of lower interconnect layers 120.

Figure 4B:
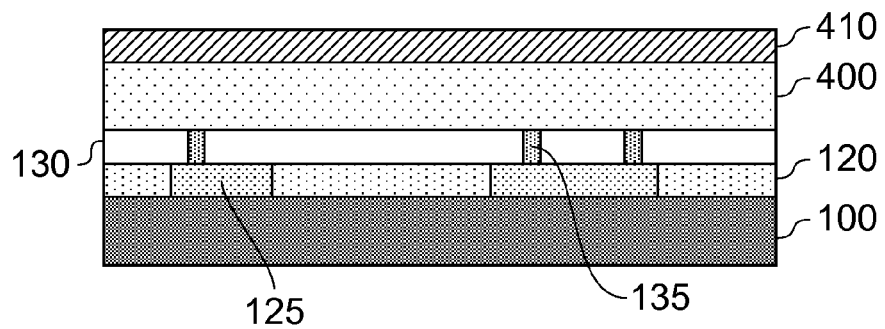

In a next step shown in FIG. 4b, a hard mask 410 is deposited over the dielectric layer 400. It will be appreciated that this step is optional, because if a material such as SiO2 is used for the dielectric layer 400, the material itself may act as a hard mask. In case a low-k material is used for the dielectric layer 400, a hard mask 410 such as a $SiO_2$ mask may be formed over the dielectric layer 400. Any suitable deposition method may be applied.

Figure 4C:
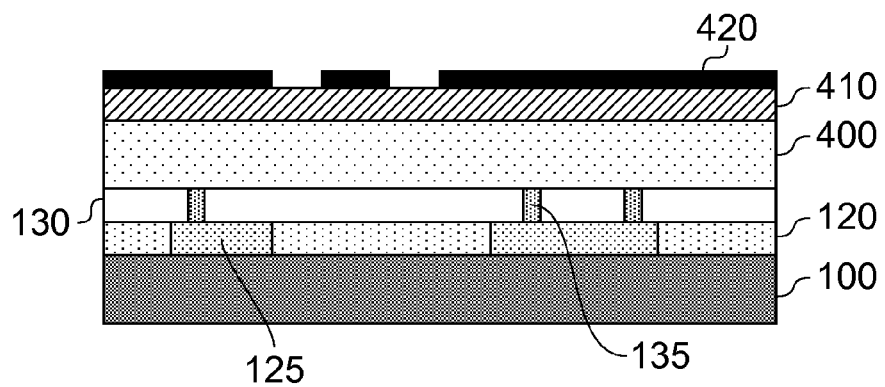

A resist layer 420 is applied to the hard mask 410, and subsequently patterned, as shown in FIG. 4c. Any suitable resist material may be used, such as a negative or positive photoresist, e.g. DNQ or Novolac. The photoresist may be applied in any suitable way, e.g. spin-coating.

Figure 4D:
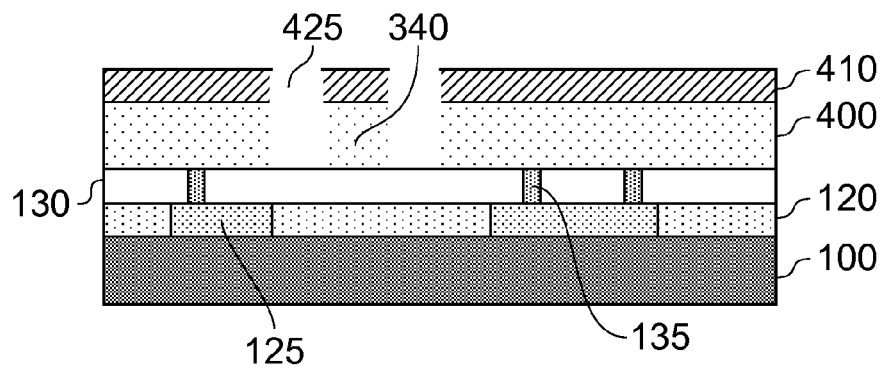

Next, trenches 425 are etched in the hard mask 410 (if present) and the dielectric layer 400. This is shown in FIG. 4d. The trenches 425 are formed in a region of the dielectric material over which a bond pad will be formed in a subsequent processing step. Such an etch step is routine practice for the skilled practitioner and will not be explained in further detail for reasons of brevity only. The number of trenches 425 is not critical, as long as one or more pillars 340 of the dielectric material 400 are formed to ensure that the interconnect layer 140 will have sufficient flexibility to withstand mechanical forces associated with subsequent processing steps, as previously explained. The resist 420 may be removed after the trench formation.

Figure 4E:
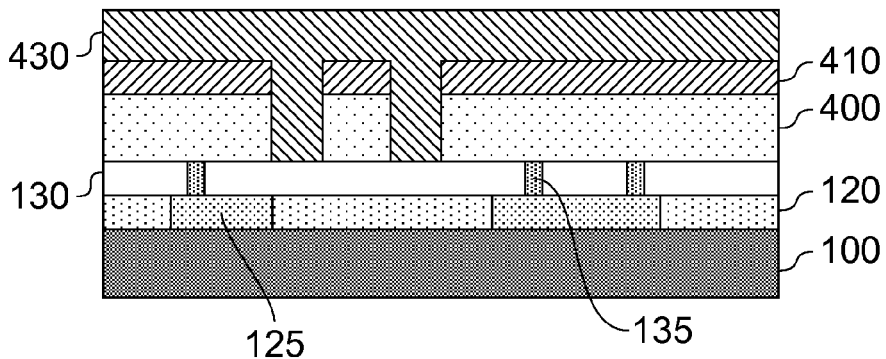
Figure 4F:
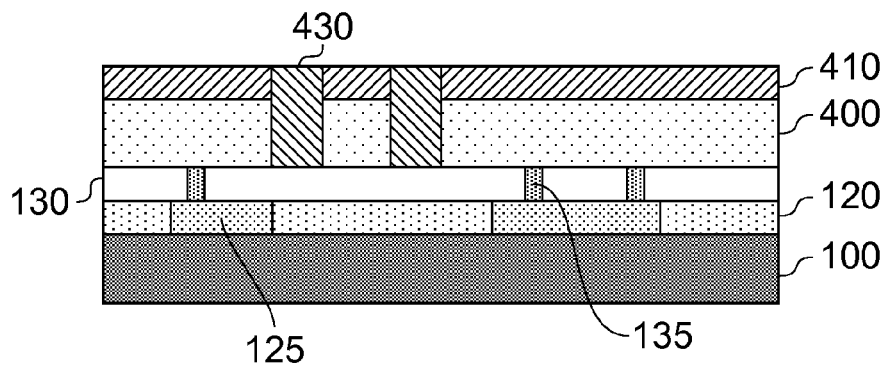

As shown in FIG. 4e, the trenches 425 are filled with a thermally decomposable polymer (TDP), which may be applied in any suitable way, e.g. spin-coating. A TDP is a polymer that decomposes in the gaseous compounds when exposed to a high enough temperature. The exact temperature depends on the type of TDP used. Any suitable TDP may be used. Non-limiting examples include polynorbornene-based polymers, polyacrylate-based polymers and XP0733 marketed by Rohm Haas™. As shown in FIG. 4f, excess TDP is removed, for instance by means of a chemical mechanical planarization (CMP) step, such that the hard mask 410 if present or the dielectric material 400 is exposed.

Figure 4G:
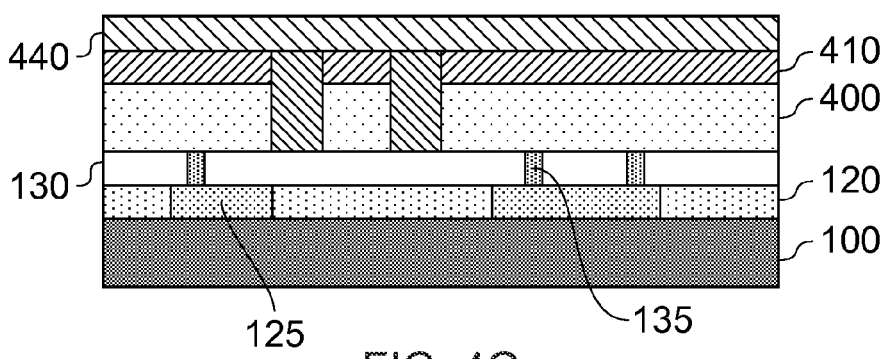

Next, another hard mask 440 is formed over the exposed hard mask 410 or the dielectric material 400. This is shown in FIG. 4g. This further hard mask 440 must be a porous material because the decomposition products of the TDP in the trenches 425 must be able to escape the trenches 425 through this hard mask 440. Suitable materials for the hard mask 440 include SiOCH based materials, amongst others. The further hard mask 440 may be deposited using any suitable deposition technique, as already explained for the hard mask 410. Preferably, when using SiOCH-based materials, the further hard mask 440 is deposited by means of plasma-enhanced chemical vapor deposition (PE-CVD).

Figure 4H:
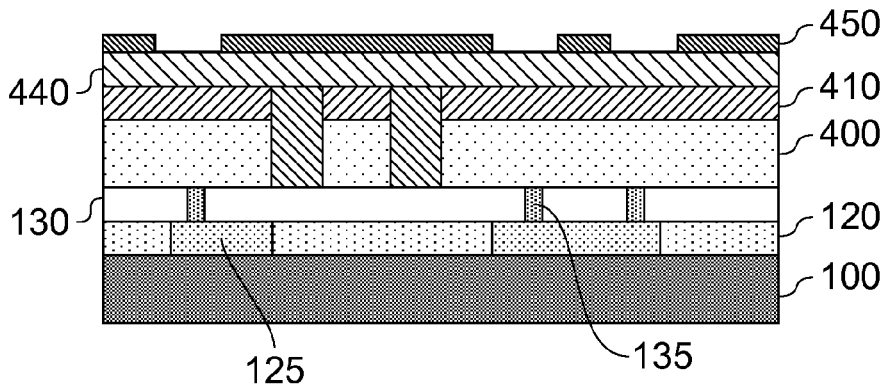
Figure 4I:
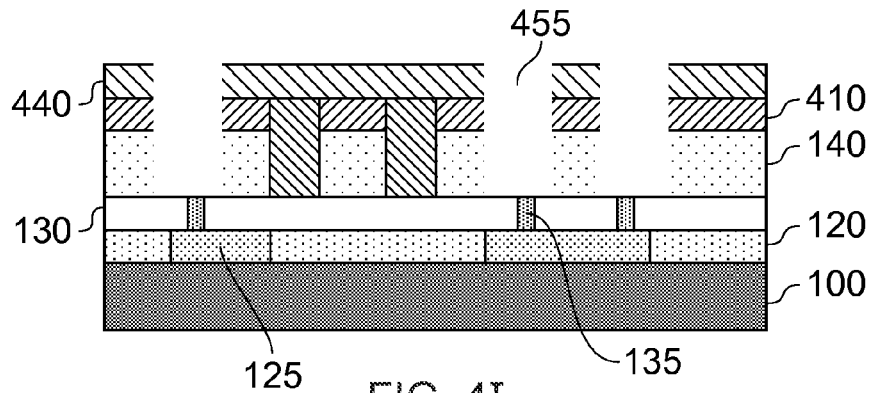
Figure 4J:
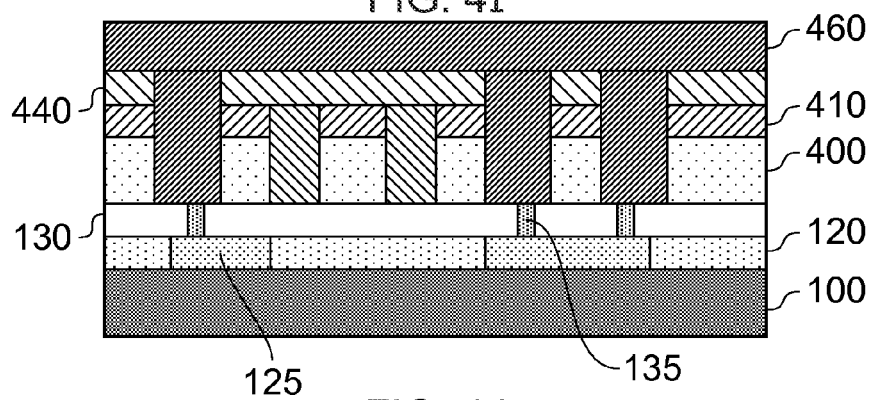

In the step shown in FIG. 4h, a further resist 450 is deposited over the further hard mask 440 and subsequently patterned. The further resist may be the same resist material as used for resist 420, or may be a different resist material. In a subsequent step, as shown in FIG. 4i, further trenches 455 are etched through the hard masks 410 and 440 and the dielectric material 400 using any suitable etching technique. Following the etching step, the further resist 450 may be removed, thereby exposing the further hard mask 440.

Figure 4K:
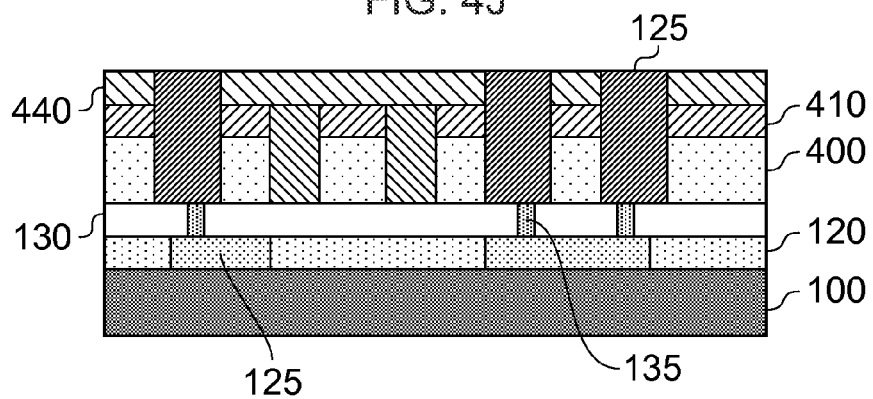

The further trenches 455 are subsequently filled with a metal to form metal tracks through the dielectric material 400. In a preferred embodiment, the metal is copper, which may be deposited in any suitable way, e.g. by means of a Damascene process, which is completed by the removal of the excess copper over the further trenches 455, e.g. by means of CMP, such that the further hard mask 440 is exposed again. This is shown in FIG. 4k.

Figure 4L:
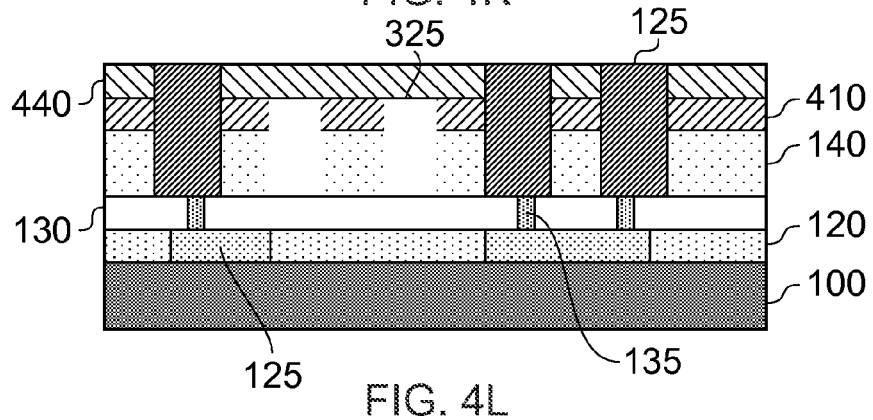

The interconnect layer 140 of the present invention can now be formed by decomposing the TDP in the trenches 425. To this end, the substrate stack is exposed to a thermal budget that is sufficient to decompose the TDP, causing the decomposition products to escape the trenches 425 through the porous further hard mask 440. Upon completion of the TDP decomposition, an interconnect layer 140 comprising metal portions 125 and air-filled trenches 325 is formed, as shown in FIG. 4l.

Figure 4M:
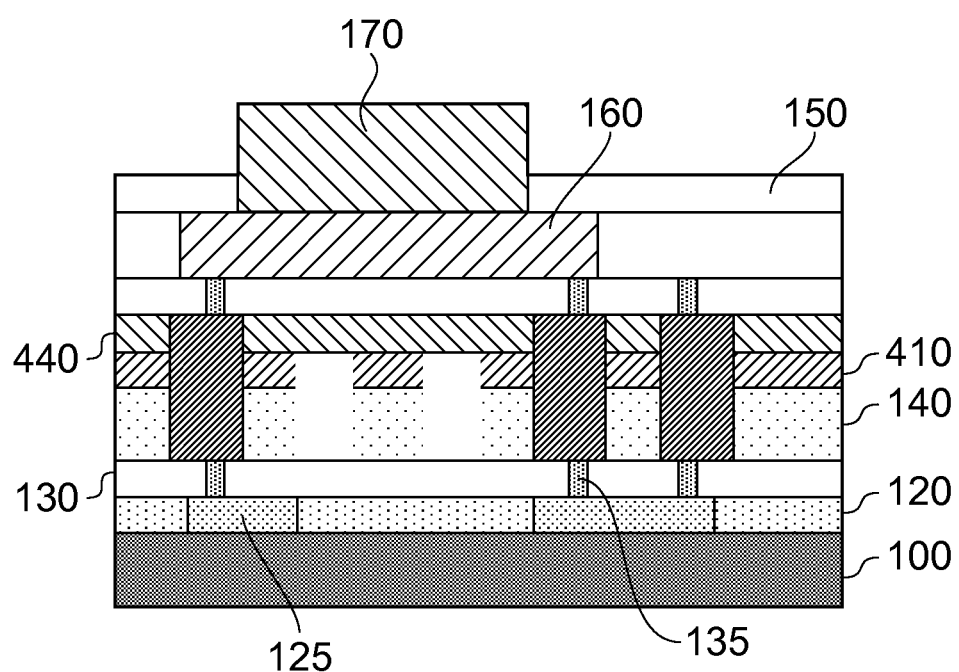

The manufacture of the IC of the present invention may now be completed, as shown in FIG. 4m. In accordance with the present invention, this includes the formation of a bond pad 160 over the portion of the interconnect layer 140 comprising the air-filled trenched 325. Other further processing steps, which may or may not include the formation of a final via layer 130 over the interconnect layer 140, the formation of the planarization layer 150 and the formation of a metal cap 170 on the bond pad 160 are not essential to the present invention and may be implemented in any suitable way.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A method of manufacturing an integrated circuit comprising:
   providing a stack of layers on a substrate, the stack including at least a first layer, the first layer comprising conductive regions;
   forming a interconnect layer over the first layer, said interconnect layer comprising a dielectric material portion to be oriented between a bond pad and the substrate stack;
   forming a plurality of trenches in said dielectric material portion;
   filling said trenches with a thermally degradable polymer;
   forming a porous capping layer over the interconnect layer;
   thermally decomposing said polymer to form air-filled trenches; and
   forming the bond pad over said portion.

2. A method according to claim 1, said trench forming step comprising:
   forming a hard mask over the interconnect layer;
   depositing a resist over the hard mask;
   patterning the resist; and
   etching the plurality of trenches.

3. A method according to claim 1, said filling step comprising:
   depositing the thermally degradable polymer over the interconnect layer, thereby filling said trenches; and
   removing excess thermally degradable polymer.

4. A method according to claim 1, further comprising:
   forming at least one further trench in said portion over at least one of said conductive regions, wherein the at least one further trench is provided in the dielectric material portion; and
   forming a metal layer over the interconnect layer, said forming step including filling the at least one further trench with the metal.

5. A method according to claim 4, said further trench formation comprising:
   depositing a further resist over the porous capping layer;
   patterning the further resist; and
   etching the at least one further trench.

6. A method according to claim 1, wherein the interconnect layer comprises patterned metal portions separated by the dielectric material.

7. A method according to claim 1, wherein the first layer is a via layer comprising a plurality of vias.

8. An integrated circuit comprising:
   a bond pad;
   a stack of layers on a substrate, the stack including at least a first layer, wherein the first layer comprises conductive regions; and
   an interconnect layer over the first layer, the interconnect layer comprising a dielectric material portion between the bond pad and the substrate stack, said dielectric material portion comprising a plurality of air-filled trenches formed by decomposing a thermally degradable polymer and defining at least one pillar of the dielectric material, at least said air-filled trenches being capped by a porous capping layer.

9. An integrated circuit according to claim 8, said interconnect layer further comprising a metal-filled trench in conductive contact with one of said conductive regions.

10. An integrated circuit according to claim 9, wherein the dielectric material portion comprises the metal-filled trench.

11. An integrated circuit according to claim 8, wherein the metal-filled trench is filled with copper.

12. An electronic device comprising an integrated circuit according to claim 8.

* * * * *